(12) United States Patent
Riedel et al.

(10) Patent No.: US 10,121,833 B2
(45) Date of Patent: Nov. 6, 2018

(54) ORGANIC LIGHT-EMITTING DIODE (71) Applicant: OSRAM OLED GmbH, Regensburg (DE)

(72) Inventors: Daniel Riedel, München (DE); Andreas Rausch, Regensburg (DE); Ulrich Niedermeier, Leiblfing (DE)

(73) Assignee: OSRAM OLED GmbH (DE)

( * ) Notice: Subject to any disclaimer, the term of this patent is extended or adjusted under 35 U.S.C. 154(b) by 0 days.

(21) Appl. No.: 15/551,216

(22) PCT Filed: Feb. 17, 2016

(86) PCT No.: PCT/EP2016/053366
§ 371 (c)(1),
(2) Date: Aug. 15, 2017

(87) PCT Pub. No.: WO2016/131873
PCT Pub. Date: Aug. 25, 2016

(65) Prior Publication Data
US 2018/0069061 A1 Mar. 8, 2018

(30) Foreign Application Priority Data
Feb. 20, 2015 (DE) .......... 10 2015 102 447

(51) Int. Cl.
*H01L 27/32* (2006.01)
*H01L 51/52* (2006.01)
(Continued)

(52) U.S. Cl.
CPC ........ *H01L 27/3237* (2013.01); *F21S 43/145* (2018.01); *H01L 51/5203* (2013.01);
(Continued)

(58) Field of Classification Search
CPC . H01L 27/32; H01L 27/3237; H01L 51/5268; H01L 51/5284
See application file for complete search history.

(56) References Cited

U.S. PATENT DOCUMENTS 5,012,107 A * 4/1991 Kano .................. G21K 4/00
250/484.4
7,052,811 B2 * 5/2006 Sakurada ............. G02B 5/201
349/106
(Continued)

FOREIGN PATENT DOCUMENTS

DE 10 2004 041 371 8/2007
DE 10 2008 019 926 7/2011
(Continued)

*Primary Examiner* — Phuc Dang
(74) *Attorney, Agent, or Firm* — DLA Piper LLP (US)

(57) ABSTRACT

An organic light-emitting diode includes at least two segments arranged adjacent to one another, a scattering layer that at least partially scatters the light generated in each of the segments, and at least one separating region located in the scattering layer, wherein the separating region has a transmittance for light generated in the segments of at most 20%, the separating region, when viewed in a plan view, is arranged in a transitional region between adjacent segments such that within the scattering layer propagation of light between the segments is suppressed, the segments include organic layer sequences each located between a first electrode and a second electrode, the segments are distant from one another in a direction parallel to the main directions of extension, and the scattering layer directly adjoins the first electrode which is light-transmitting and directly adjoins a transparent layer on a side remote from the first electrode.

13 Claims, 4 Drawing Sheets

(51) Int. Cl.
*F21S 43/145* (2018.01)
*F21W 103/00* (2018.01)

(52) U.S. Cl.
CPC ...... H01L 51/5268 (2013.01); H01L 51/5284 (2013.01); *F21W 2103/00* (2018.01); *H01L 2251/5361* (2013.01)

(56) References Cited

U.S. PATENT DOCUMENTS

2015/0285969 A1* 10/2015 Kim ..................... G02B 5/201
 359/891
2016/0195773 A1* 7/2016 Lee ................... G02F 1/133617
 349/71

FOREIGN PATENT DOCUMENTS

| | | |
|---|---|---|
| DE | 10 2015 102 105 | 8/2016 |
| EP | 2 613 374 | 7/2013 |
| WO | 2007/008946 | 1/2007 |

\* cited by examiner

ORGANIC LIGHT-EMITTING DIODE

TECHNICAL FIELD

This disclosure relates to an organic light-emitting diode.

BACKGROUND

There is a need to provide an organic light-emitting diode with a plurality of light-emitting segments that are separated from one another by a sharp edge.

SUMMARY

We provide an organic light-emitting diode including: at least two segments electrically mutually independently operable, configured to generate light and arranged adjacent to one another when viewed in a plan view, a scattering layer that at least partially scatters the light generated in each of the segments, and at least one separating region located in the scattering layer, wherein, in a direction parallel to main directions of an extension of the scattering layer, the separating region has a transmittance for light generated in the segments of at most 20%, the separating region, when viewed in a plan view, is arranged in a transitional region between adjacent segments such that within the scattering layer propagation of light between the segments is suppressed, the segments include organic layer sequences each located between a first electrode and a second electrode, the segments are distant from one another in a direction parallel to the main directions of extension, and the scattering layer directly adjoins the first electrode which is light-transmitting and directly adjoins a transparent layer on a side remote from the first electrode.

We also provide a part of a rear light of a motor vehicle including the organic light-emitting diode.

We yet further provide an organic light-emitting diode including: at least two segments configured to generate light and arranged adjacent to one another when viewed in a plan view, a scattering layer that at least partially scatters the light generated in each of the segments, and at least one separating region located in the scattering layer, wherein in a direction parallel to main directions of extension of the scattering layer, the separating region has a transmittance for light generated in the segments of at most 20%, and the separating region, when viewed in a plan view, is arranged in a transitional region between adjacent segments such that within the scattering layer propagation of light between the segments is suppressed.

BRIEF DESCRIPTION OF THE DRAWINGS

FIGS. 1 to 7A are schematic sectional representations of examples of organic light-emitting diodes.

LIST OF REFERENCE SIGNS

1 Substrate
2 Light-generating segment
22 Organic layer sequence
3 Scattering layer
33 Scattering particles
34 Matrix material
4 Optical separating region
5 First electrode
6 Second electrode
7 Encapsulation layer
8 Optical insulation
9 Current spreading structure
10 Organic light-emitting diode
11 Rear light
d Average distance between adjacent segments
M Main direction of extension of the scattering layer
w Average lateral extent of the segments
x Throughput direction

DETAILED DESCRIPTION

Our organic light-emitting diode may comprise two or more than two segments. The segments are each configured to generate light, for example, colored light such as blue light, green light, yellow light, orange light or red light or indeed to generate polychromatic light such as white light. The segments are preferably electrically mutually independently drivable and separately operable.

The segments may be arranged adjacent to one another when viewed in plan view. This means in particular that the segments and specifically the electrodes thereof are not mounted/stacked on one another. It is moreover possible that regions of the segments provided to generate radiation do not overlap. It is not ruled out, in this respect, that an organic layer sequence of the segments configured to generate the light extends continuously over the segments or indeed is slightly overlapping in an edge region preferably configured not to generate the light. However, no additional functionality is achieved by the overlap of the organic layer sequences which is optionally present, such an overlap then arising only within the bounds of manufacturing tolerances.

The organic light-emitting diode may comprise one or more scattering layers. The at least one scattering layer is configured to scatter the light generated in each of the segments at least in part. In particular, the scattering layer is a light-transmitting layer that appears milky-opaque to an observer. Furthermore, the light generated in the segments preferably exits the organic light-emitting diode wholly or partly through the scattering layer.

At least one separating region may be located in the scattering layer. The separating region may be configured for optical separation and/or subdivision of the scattering layer. The at least one separating region subdivides the scattering layer into regions which, when viewed in plan view, are preferably arranged congruently relative to the segments.

In a direction parallel to the main directions of extension of the scattering layer the separating region may have a transmittance for the light generated in the segments of at most 20 or 10% or 5% or 1%. The separating region may also be non-transmissive to the light generated in the segments. If the transmittance of the separating region is, for example, at most 20%, at most 20% of the light generated in one of the segments, taking a course parallel to the main directions of extension and incident on the separating region passes through the separating region. In other words, the separating region provides optical insulation.

The separating region, when viewed in plan view, may be arranged in a transitional region between adjacent segments. In this way, light propagation between adjacent segments within the scattering layer is suppressed or prevented. In particular, the at least one separating region is located solely in the transitional region, when viewed in plan view.

The organic light-emitting diode may comprise at least two segments configured to generate light and arranged adjacent one another when viewed in plan view. A scattering layer at least partially scatters the light generated in each of the segments. At least one separating region is located in the scattering layer. In a direction parallel to main directions of extension of the scattering layer, the separating region has a transmittance for the light generated in the segments of at most 20%. When viewed in plan view, the separating region is arranged in a transitional region between adjacent segments. Within the scattering layer, propagation of light between the segments is suppressed or prevented by the separating region.

The separating region ensures that a sharp edge is formed between the segments from the point of view of the observer and thus a high optical contrast is achieved. In a light-emitting diode not comprising a separating region and in which the segments are applied to a scattering layer, there is as a rule no sharply defined contrast edge between the segments since the scattering layer blends the light emitted in the segments and a transitional region between the segments thus appears blurred to an observer.

An average distance between the adjacent segments may amount to at most 0.5 mm or 0.3 mm or 0.1 mm or 25 µm. Alternatively or in addition, this average distance is at least 10 µm or 50 µm or 0.1 mm. The average distance is preferably selected to be so small that, when the organic light-emitting diode is used properly, the adjacent segments appear contiguous and gap-free to an observer.

An average extent of the segments in a direction parallel to the main directions of extension of the scattering layer may be at least 50 times or 100 times or 500 times the average distance between the adjacent segments. Alternatively or in addition, the average extent of the segments is at least 5 mm or 20 mm or 60 mm.

The scattering layer, in a throughput direction perpendicular to the main directions of extension, may have an opacity value of at least 0.5 or 0.6 or 0.7. Alternatively or in addition, the opacity value is at most 0.99 or 0.9 or 0.85.

The opacity value is also known as haze value or haziness. The opacity value is defined, for example, for transmission as the quotient of the proportion of radiation scattered by an angle of more than 2.5° on passage through a medium and the total radiation transmitted by the medium.

The separating region may have an average width in a direction parallel to at least one or in a direction parallel to precisely one of the main directions of extension of the scattering layer of at most 100 µm or 50 µm or 20 µm. Alternatively or in addition, the average width of the separating region is at least 5 µm or 10 µm or 20 µm. The width or average width of the separating region is preferably so small that the separating region is not perceived by an observer when the organic light-emitting diode is in proper use.

The scattering layer may extend with a constant thickness over all the segments. In this case, the separating region should be regarded as part of the scattering layer. This then means that, in a direction perpendicular to the main directions of extension, the scattering layer and the at least one separating region may have the same thickness, within the bounds of manufacturing tolerances.

The at least one separating region may extend right through the scattering layer in a direction perpendicular to the main directions of extension. This means that the scattering layer is completely interrupted by the separating region. Different regions of the scattering layer with a light-scattering effect, which are associated with the individual segments, are then not connected together by any contiguous, scattering sublayer of the scattering layer.

The scattering layer may have a thickness of at least 1 µm or 10 µm or 20 µm. Alternatively or in addition, the thickness of the scattering layer is at most 100 µm or 50 µm or 25 µm.

The scattering layer may have a multiplicity of scattering particles or scattering centers to scatter light. The scattering particles preferably comprise inorganic scattering particles, preferably of a material with a high refractive index such as titanium dioxide or zirconium dioxide. It is possible for an average diameter of the scattering particles to be at least 100 nm or 250 nm or 500 nm and/or at most 5 µm or 1 µm or 0.5 µm.

The separating region or the separating regions may be free of the scattering particles. The scattering layer may in this respect be applied already with appropriate patterning or alternatively the scattering particles are subsequently removed from the separating regions and/or destroyed.

The scattering layer may comprise a matrix material. The scattering particles may be introduced into and embedded in the matrix material. The matrix material, for example, comprises an inorganic material such as a glass. It is likewise possible for the matrix material to be formed by an organic material such as a polymer. The matrix material, for example, comprises an epoxide, a silicone, an epoxide-silicone hybrid material, a polycarbonate or an acrylate.

Alternatively or in addition, the matrix material may also contain or consist of metal oxides, i.e. for example, the following substances: silicon oxide (SiO2), zinc oxide (ZnO), zirconium oxide (ZrO2), indium-tin oxide (ITO), antimony-tin oxide (ATO), aluminum-zinc oxide layer (AZO), indium-zinc oxide (IZO), gallium oxide (Ga2Ox), aluminum oxide (Al2O3), titanium oxide.

The matrix material of the scattering layer may be partially or completely decomposed in the at least one separating region. This means that the scattering layer and the separating region originally comprise the same matrix material. When the separating region is produced, the matrix material is decomposed, for example, chemically and/or through exposure to light and/or physically, for instance through exposure to heat. This decomposition is preferably effected by laser treatment. As a result of decomposition of the matrix material, the color appearance thereof and the optical properties thereof may be modified. For example, the non-decomposed matrix material is transparent and transmissive to the light generated in the segments. The decomposed matrix material is then preferably non-radiation-transmissive, in particular brown or black.

On at least one side facing the scattering layer or overall, the separating region may be absorbing for the light generated in the segments. Absorbing may mean that a reflectance of a material of the at least one separating region is at most 50% or 30% or 5%. The separating region is then in particular formed of the decomposed matrix material of the scattering layer.

The separating region may comprise at least one metal or one metal alloy or consists of a metal or a metal alloy. In this case, it is possible for the separating region to comprise an additional, electrically insulating layer, for instance of an oxide layer of the metal from which the separating region is formed, at least on one side facing the segments.

The separating region may be configured, on at least one side facing the scattering layer or overall on the outer sides, to be reflective for the light generated in the segments. Reflective preferably means that an average reflectance for the light generated in the segments amounts to at least 50% or 80% or 90%. The separating region may, for example, appear white to an observer. The separating region preferably does not have any or any significant spectral dependence in reflection for the light generated in the segments. The same preferably also applies for the absorption behavior of the separating region.

The separating region may be configured to be electrically conductive. The separating region is either wholly electrically conductive or comprises at least one electrically conductive sub-region.

When the light-emitting diode is used properly, the separating region may be configured to carry electrical current, i.e. the separating region in particular connects electrically conductively to external electrical connections of the organic light-emitting diode.

The separating region may be in direct electrical contact with at least one electrode of the organic light-emitting diode. That is to say, the separating region may touch the at least one electrode. It is furthermore preferable for the separating region not to be in direct electrical and/or mechanical contact with the organic light-emitting layer stack of the segments.

The electrodes may be configured to inject current into the segments and into the organic, light-emitting layer sequence of the segments. In this case, the electrode preferably facing the scattering layer comprises a light-transmitting electrode and a further one of the electrodes is preferably reflective. The reflective electrode is in particular remote from the scattering layer. The transmissive electrode is located partially or completely between the scattering layer and the organic layer sequences of the segments.

The separating region, for example, electrically conductively connects to, for example, branched, linear current spreading structures also known as busbars. In this case, preferably no direct current injection into the organic layer sequences of the segments takes place via the separating region.

A region between the segments, in a direction parallel to the main directions of extension and in the same plane as the organic layer sequences, may be transmissive for the light generated in the segments. In other words, no opaque material is then mounted directly between the segments. Alternatively, optical insulation may also be present between the segments in the plane of the segments.

The at least one separating region and the segments may overlap, when viewed in plan view. In particular, when viewed in plan view an intermediate region between the segments may be completely covered by the separating region. It is likewise possible for one or more of the electrodes of the segments to overlap with the separating region when viewed in plan view.

The segments or groups of segments may be configured to generate light of the same color. This means that these segments generate light of the same spectrum, within the bounds of manufacturing tolerances. Alternatively, it is possible for different segments to be configured to generate light of different colors.

The light generated in the segments may be emitted in unmodified or in virtually unmodified spectral composition by the organic light-emitting diode. That is to say, further components of the light-emitting diode such as the separating region, the scattering layer or the electrodes, do not contribute or contribute only insignificantly to a modification in the spectrum of the light generated in the segments.

The organic light-emitting diode may be part of a rear light of a motor vehicle or the organic light-emitting diode may be a rear light of a motor vehicle. The motor vehicle for instance is an automobile.

The light-emitting diode may be installed in a general lighting apparatus. It is moreover possible for the organic light-emitting diode to be used in information lighting, specifically a "low content display".

The organic light-emitting diode may comprise at least two or at least four or at least six of the segments. Alternatively or in addition, the number of segments in the light-emitting diode is at most 32 or 25 or 16 or 10. In other words, the organic light-emitting diode is then precisely not a high-resolution display with a vast number of pixels.

All the segments of the organic light-emitting diode may be configured to generate white light. The various segments or groups of segments are in this case configured to generate white light of different color temperatures. By driving one or more segments of the light-emitting diode, a color temperature of the light emitted overall by the organic light-emitting diode is thereby adjustable. In particular, multiple segments are then properly provided for simultaneous operation.

An organic light-emitting diode described herein is explained in greater detail below by way of examples with reference to the drawings. Elements which are the same in the individual figures are indicated with the same reference numerals. The relationships between the elements are not shown to scale, however, but rather individual elements may be shown exaggeratedly large to assist in understanding.

Figure 1:
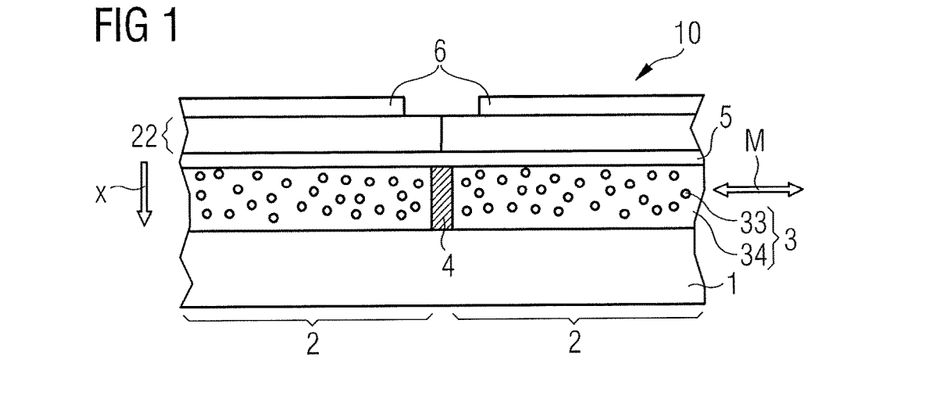

FIG. 1 shows an example of an organic light-emitting diode 10. The organic light-emitting diode 10 comprises a substrate 1, for example, of a transparent material such as a glass or a plastics material. The substrate 1 may be mechanically rigid or indeed mechanically flexible.

A scattering layer 3 is applied to the substrate 1. The scattering layer 3 comprises a matrix material 34, for example, comprising an organic material. Scattering particles 33 are embedded into the matrix material 34 which have a different, in particular higher, refractive index than the matrix material.

On a side of the scattering layer 3 remote from the substrate 1 there is located a first electrode 5, preferably of a light-transmitting, transparent material such as a transparent conductive oxide, or TCO for short. In particular, the first electrode 5 is made from ITO. The first electrode 5 may be a continuous, uninterrupted layer.

Organic layer sequences 22 are applied to a side of the first electrode remote from the substrate 1. The organic layer sequences 22 form light-generating segments 2. The organic layer sequences 22 contain at least one active layer that generates visible light. It is possible for the organic layer sequences 22 to touch and abut one another in a main direction of extension M of the scattering layer 3.

A second electrode 6 is applied to the organic layer sequences 22 on a side remote from the substrate 1. The second electrode 6 preferably comprises a metallic layer that reflects the light generated in the layer sequences 22. The second electrode 6 is preferably patterned and not applied continuously. In contrast to what is shown, patterning to form the segments 2 optionally also proceeds by the first electrode 5.

According to FIG. 1, the organic light-emitting diode 10 comprises just two of the segments 2. However, more than two of the segments 2 may also be present. Furthermore, further components of the organic light-emitting diode 10 such as encapsulation layers or external electrical contacts, are not shown for simplicity's sake. It is optionally possible, as also in all the other examples, for a luminescent material for partial or complete conversion of the radiation generated in the layer sequences 22 to be added to one component of the organic light-emitting diode 10, for instance the scattering layer 3. Preferably, however, the organic light-emitting diode 10 is free of luminescent materials.

The light generated in the electrically mutually independently drivable organic layer sequences 22 is scattered in the scattering layer 3 such that a radiation outcoupling efficiency in a throughput direction x through the substrate 1 is increased. To this end, the scattering layer 3 preferably has a comparatively high opacity value of at least 0.5. However, to suppress or prevent propagation of light generated in the segments 2 between the segments 2 within the scattering layer 3, an optical separating region 4 is provided in a transitional region between the segments 2. In the main direction of extension M the separating region 4 is non-transmissive to the light generated in the segments 2.

The separating region 4 is formed, for example, by patterned application of the scattering layer 3 and of the separating region 4. It is likewise possible for the separating region 4 to be subsequently produced in the scattering layer 3. For example, the matrix material 34, initially applied continuously, is decomposed photochemically, for instance by laser radiation, in the separating region 4 to be formed. As a result of this decomposition, the matrix material 34 may become black and thus absorbing and opaque. As an alternative, the separating region 4 is formed from a different material than the scattering layer 3, for example, from a white plastics material or indeed from a reflective metal.

The segments 2 may emit light of different colors or indeed in each case light of the same color. The scattering layer 3 is preferably identical over all the segments 2 and has the same material composition and thickness throughout, within the bounds of manufacturing tolerances. The organic layer sequences 22 of the segments 2 are arranged adjacent to one another, when viewed in plan view, and not above one another and not stacked.

Figure 2:
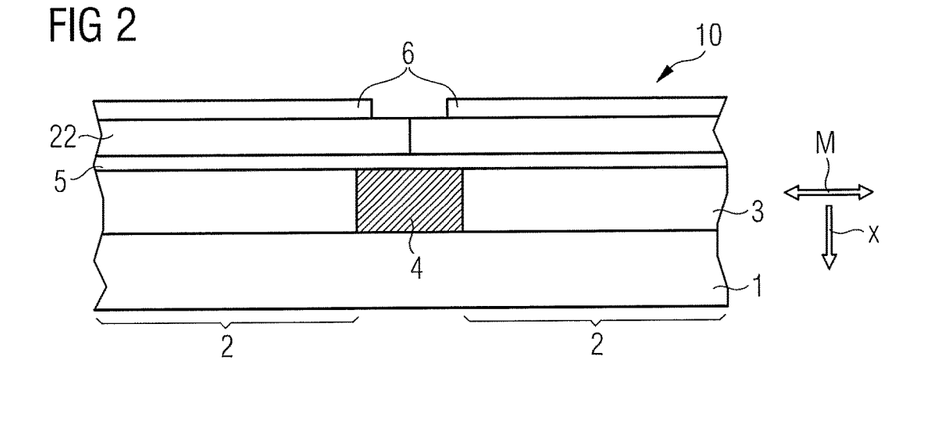

In the example shown in FIG. 2, there is just one contiguously applied organic layer sequence 22. Patterning to yield the segments 2 proceeds by the second electrode 6 and, unlike in the illustration, optionally also by the first electrode 5. Since the organic layer sequence 22 has negligible electrical conductivity in the main direction of extension M, current flow between the electrodes 6 proceeds substantially only in the throughput direction x. Thus, as a result of purposeful energization of the regions of the second electrode 6, the segments 2 are electrically mutually independently drivable, despite the continuous organic layer sequence 22.

The organic layer sequence 22 is furthermore comparatively thin and, in addition, is insignificantly radiation-absorbing. Therefore, conduction of light generated in the segments 2 within the organic layer sequence 22 has only a relatively small range. This is likewise true of light conduction within the first electrode 5. Optical insulation between the segments 2 is thus achieved by the separating region 4. The separating region 4 is here, when viewed in plan view, preferably so narrow that the separating region 4 is not visible to an external observer when the organic light-emitting diode 10 is in proper use. A width of the separating region 4 is, for example, greater than a distance between the regions of the second electrode 6 on the side of the organic layer sequence 22 remote from the substrate 1.

Figure 3:
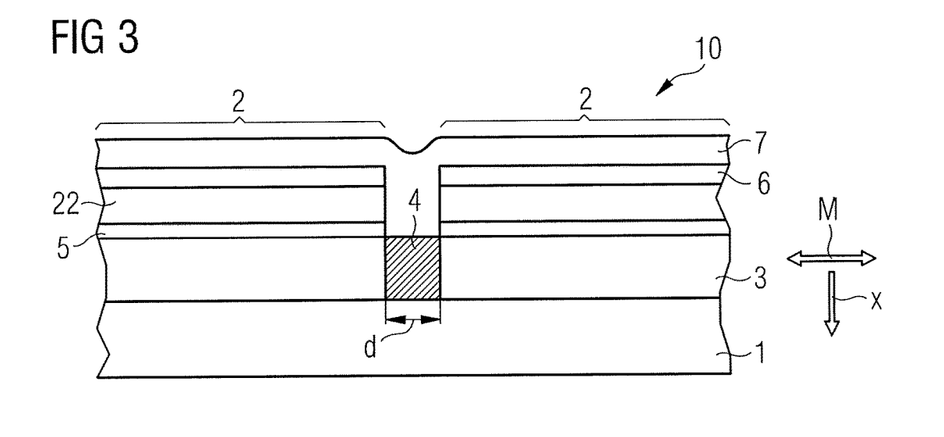

In the example of FIG. 3, the electrodes 5, 6 and the organic layer sequence 22 are configured to be congruent. A distance d between the segments 2 corresponds to a distance between the organic layer sequences 22 and also to a width of the separating region 4.

Optionally, as also in all the other examples, an encapsulation layer 7, in particular a "thin-film encapsulation", is present. A material of the encapsulation layer 7 may extend into the region between the organic layer sequences 22, in a plane parallel to the main direction of extension M, and partially or completely fill this region. The material of the encapsulation layer 7 is preferably clear and transparent, for example, comprising silicon dioxide.

Figure 4:
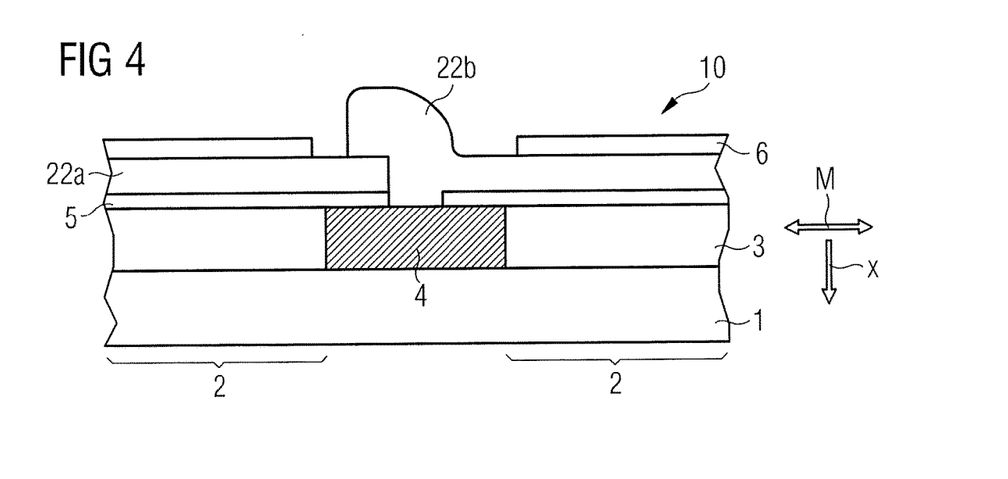

According to the example of the organic light-emitting diode 10, as shown in FIG. 4, the organic layer sequences 22a, 22b overlap slightly in the transitional region between the segments 2. The separating region 4 preferably extends right over this overlap region between the organic layer sequences 22a, 22b. This comparatively small overlap region between the layer sequences 22a, 22b is neither optically nor electrically functionalized and arises as a result of manufacturing tolerances, for instance on production of an organic light-emitting diode according to FIG. 1. In the main direction of extension M the two electrodes 5, 6 optionally have different widths.

Figure 5:
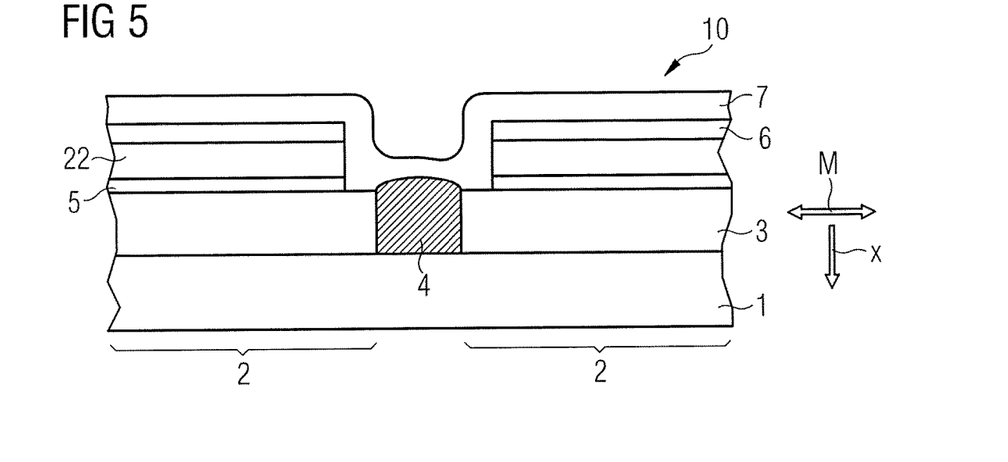

FIG. 5 shows that the encapsulation layer 7 is only comparatively thin and only partially fills a region between the organic layer sequences 22. The encapsulation layer 7 is optionally reflective. The encapsulation layer 7 preferably comprises an electrically insulating layer.

FIG. 5 additionally shows that the separating region 4 is neither in contact with the organic layer sequences 22 nor with the electrodes 5, 6. As also in all the other examples, it is possible for the separating region 4 to touch the encapsulation layer 7.

As a result of the production process, on decomposition for instance of the matrix material of the scattering layer 3, not specifically shown in FIG. 5, an increase or indeed decrease in volume may take place. In this way, at variance with FIGS. 1 to 4, a thickness of the separating region 4 in the throughput direction x may differ from a thickness of the other regions of the scattering layer 3. In FIG. 5 the separating region 4 projects above the remaining parts of the scattering layer 3, in a direction away from the substrate 1. Alternatively, a dent may be formed.

Figure 6:
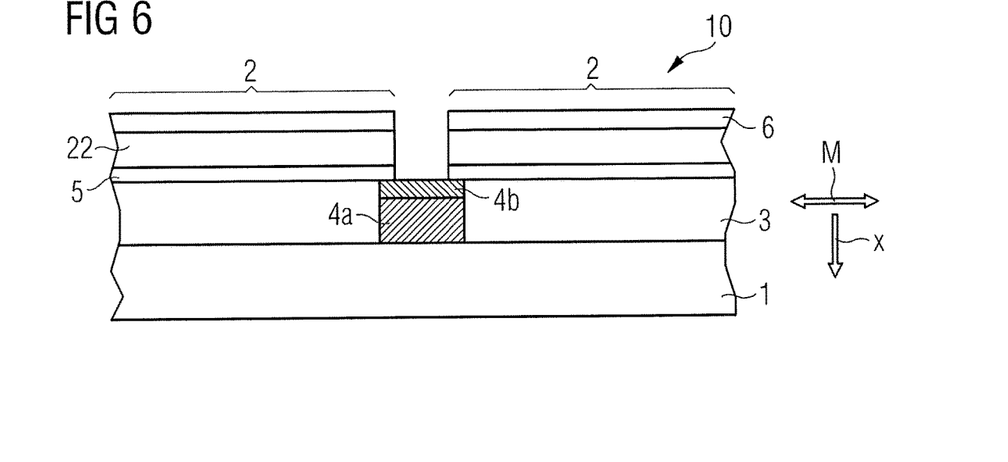

In the example illustrated in FIG. 6, the separating region is divided into parts 4a, 4b. The first part 4a is, for example, a metallic region and electrically conductive. The second part 4b electrically insulates the first part 4a from the first electrode 5. The second part 4b preferably likewise comprises a radiation-opaque region. If the second part 4b is formed from a transparent material, the thickness of the second part 4b is preferably so low that the transmissivity through the parts 4a, 4b of the separating region is not increased or is increased only insignificantly.

Figure 7A:
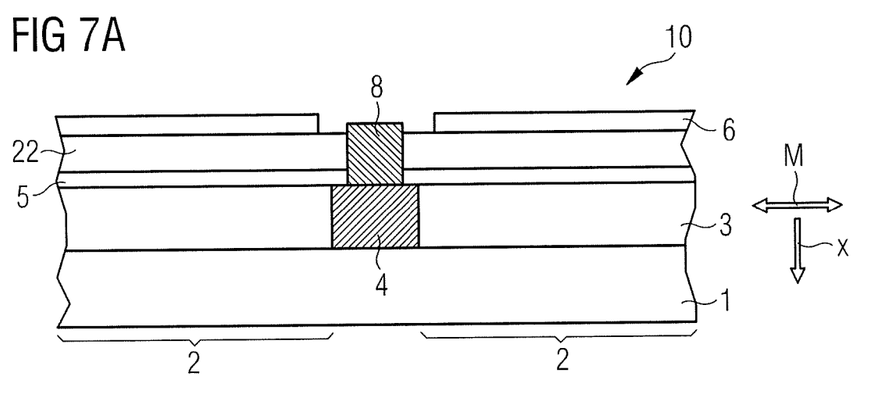
Figure 7B:
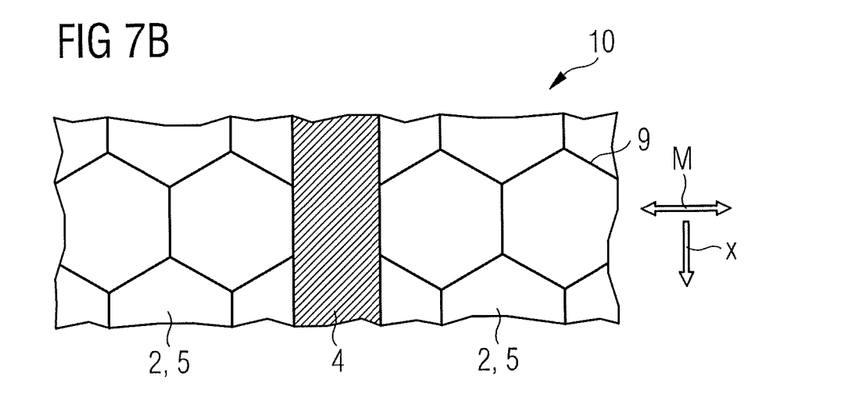
FIGS. 7B and 8A are schematic plan views of examples of organic light-emitting diodes.

In the example of FIG. 7, the separating region 4 is electrically conductive and configured to carry current when in proper use. The separating region 4 is in this case preferably not in direct electrical contact with the organic layer sequences 22. In particular, the separating region 4 is in electrical contact with a current spreading structure 9, which may comprise "busbars". In this case, when viewed in plan view, the width of the separating region 4 may exceed the width of the current spreading structures 9 or vice versa. In contrast to what is shown in FIG. 7A, it is possible in this case for the separating region 4 to be electrically insulated from the first electrodes 5 and to be in electrical contact solely with the current spreading structure 9 and with external electrical connections, not shown.

Figure 8A:
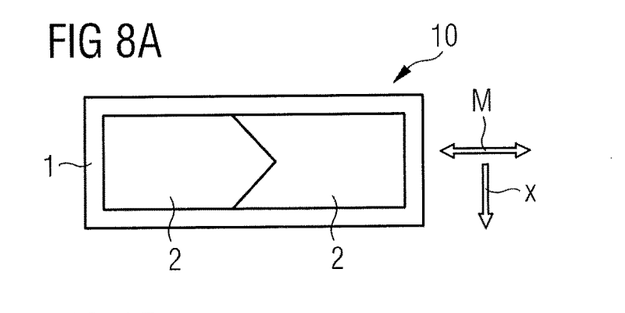

When viewed in plan view, the separating region 4 thus ensures a sharp, high-contrast transition between the segments 2 for an observer, without blurring of the color appearances between the segments 2, cf. FIG. 8A.

Figure 8B:
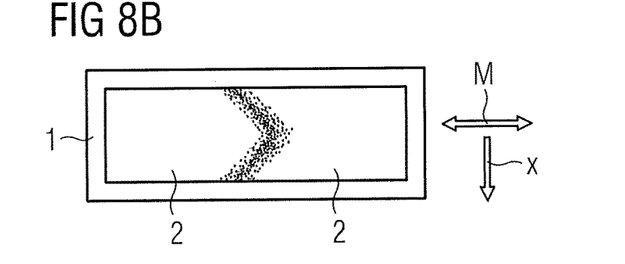
FIGS. 8B and 8C are a schematic plan view and a schematic sectional representation of a modified organic light-emitting diode.
Figure 8C:
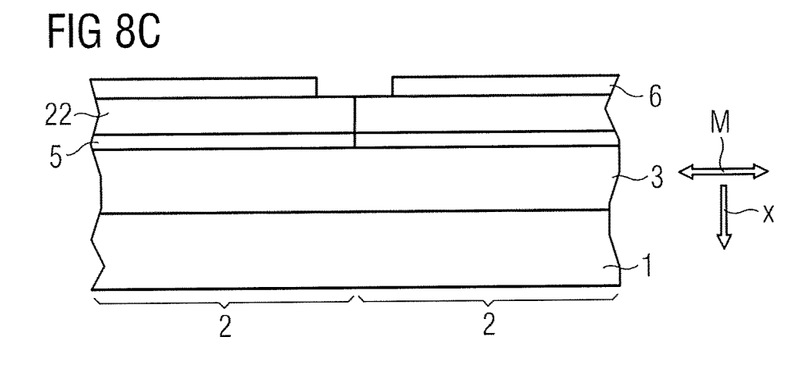

If no separating region is present, cf. the sectional representation in FIG. 8C, an observer perceives the color appearance of the segments 2 as blurred, see FIG. 8B. In many applications, such blurring is undesirable or conflicts with the functioning of the light-emitting diode 10.

Figure 9:
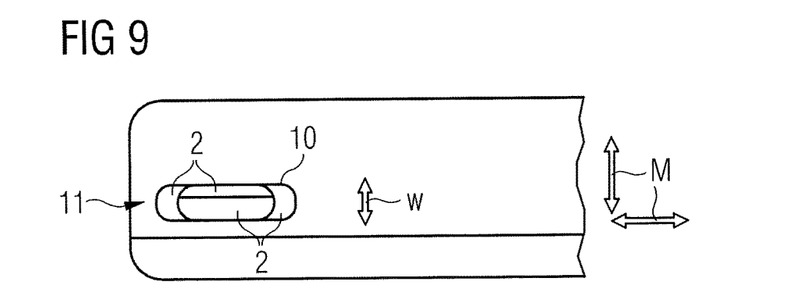
FIG. 9 is a schematic plan view of a rear light with an organic light-emitting diode.

FIG. 9 shows that the organic light-emitting diode 10 is part of a rear light 11 of a motor vehicle. The organic light-emitting diode 10 may in this case simultaneously fulfill multiple lighting functions, for example, as rear light, brake light and/or blinker. The segments 2 may accordingly emit in the same color or in different colors, in particular red light and orange light. An average lateral extent w of the segments 2 is preferably in each case in the region of several centimeters.

The organic light-emitting diodes described here are not limited by the description provided with reference to the examples. Rather, this disclosure encompasses any novel feature and any combination of features, including in particular any combination of features in the appended claims, even if the feature and combination are not themselves explicitly indicated in the claims or examples.

This application claims priority of DE 10 2015 102 447.0, the subject matter of which is incorporated herein by reference.

The invention claimed is:

1. An organic light-emitting diode comprising:
   at least two segments electrically mutually independently operable, configured to generate light and arranged adjacent to one another when viewed in a plan view,
   a scattering layer that at least partially scatters the light generated in each of the segments, and
   at least one separating region located in the scattering layer,
   wherein
   in a direction parallel to main directions of an extension of the scattering layer, the separating region has a transmittance for light generated in the segments of at most 20%,
   the separating region, when viewed in a plan view, is arranged in a transitional region between adjacent segments such that within the scattering layer propagation of light between the segments is suppressed,
   the segments comprise organic layer sequences each located between a first electrode and a second electrode,
   the segments are distant from one another in a direction parallel to the main directions of extension, and
   the scattering layer directly adjoins the first electrode which is light-transmitting and directly adjoins a transparent layer on a side remote from the first electrode.

2. The organic light-emitting diode according to claim 1, wherein
   an average distance between the adjacent segments is at most 0.3 mm,
   an average extent of the segments in a direction parallel to the main directions of extension is at least 100 times an average distance, and
   the scattering layer, in a throughput direction perpendicular to the main directions of extension, has an opacity value of 0.5 to 0.99.

3. The organic light-emitting diode according to claim 1, wherein the separating region has an average width in a direction parallel to at least one of the main directions of extension of at most 100 µm, and the scattering layer, together with the separating region, extends with a constant thickness over all the segments.

4. The organic light-emitting diode according to claim 1, wherein
   the separating region passes right through the scattering layer in a direction perpendicular to the main directions of extension, and
   a thickness of the scattering layer is 1 µm to 50 µm.

5. The organic light-emitting diode according to claim 1, wherein
   the scattering layer comprises a multiplicity of inorganic scattering particles to scatter the light, and
   the separating region is free of the scattering particles.

6. The organic light-emitting diode according to claim 1, wherein
   the scattering layer comprises an organic matrix material, and
   the matrix material is at least partly decomposed in the separating region and, on at least one side facing the scattering layer, the separating region absorbs light.

7. The organic light-emitting diode according to claim 1, wherein
   the separating region comprises a metal or a metal alloy, and, on at least one side facing the scattering layer, the separating region reflects light.

8. The organic light-emitting diode according to claim 1, wherein
   the separating region is electrically conductive or comprises an electrically conductive sub-region, and
   the separating region carries electrical current when the light-emitting diode is in use.

9. The organic light-emitting diode according to claim 1, wherein
   the separating region is in electrical contact with at least one of the electrodes of the organic light-emitting diode, and
   the electrodes are configured to inject current into the segments and the second electrode is reflective.

10. The organic light-emitting diode according to claim 1, wherein a region between the segments, in a direction parallel to the main directions of extension, is transmissive for the light generated in the segments.

11. The organic light-emitting diode according to claim 1, wherein the separating region and the segments overlap one another, when viewed in plan view.

12. The organic light-emitting diode according to claim 1, wherein
   the segments each generate light of the same color, and
   the light generated in the segments is emitted in unmodified spectral composition by the organic light-emitting diode.

13. A part of a rear light of a motor vehicle comprising the organic light-emitting diode according to claim 1.

* * * * *